United States Patent [19]

Samata et al.

[11] Patent Number: 5,057,899
[45] Date of Patent: Oct. 15, 1991

[54] SEMICONDUCTOR DEVICE WITH IMPROVED WIRING CONTACT PORTION

[75] Inventors: Shuichi Samata; Yoshiaki Matsushita, both of Kanagawa, Japan

[73] Assignee: Kabushiki Kaisha Toshiba, Kanagawa, Japan

[21] Appl. No.: 552,056

[22] Filed: Jul. 13, 1990

[30] Foreign Application Priority Data

Aug. 29, 1989 [JP] Japan .................................. 1-222678

[51] Int. Cl.$^5$ ............................................. H01L 21/40
[52] U.S. Cl. ....................................... 357/68; 357/71; 357/59
[58] Field of Search ..................... 357/41, 23.1, 59, 67, 357/71, 68

[56] References Cited

U.S. PATENT DOCUMENTS 3,681,668  8/1972  Kobayashi ............................ 357/59
4,563,807  1/1986  Sakai et al. ........................... 357/59

FOREIGN PATENT DOCUMENTS 63-44725  2/1988  Japan .

OTHER PUBLICATIONS

"Low-Resistive and Selective Silicon Growth as a Self-Aligned Contact Hole Filler and its Application to 1M bit Static RAM", Shibata et al., pp. 75–76.
Solid State Technology/Aug. 1985, pp. 141–148; "Advanced Dielectric Isolation Through Selective Epitaxial Growth Techniques", Borland et al.

Primary Examiner—Rolf Hille
Assistant Examiner—S. V. Clark
Attorney, Agent, or Firm—Finnegan, Henderson, Farabow, Garrett, and Dunner

[57] ABSTRACT

A semiconductor device includes a semiconductor layer, an insulating layer on the semiconductor layer, including a discontinuity therein, a monocrystalline silicon layer on a portion of semiconductor layer defined by the discontinuity, a non-monocrystalline silicon layer on the monocrystalline silicon layer, and a wiring layer on the non-monocrystalline silicon layer.

6 Claims, 2 Drawing Sheets

SEMICONDUCTOR DEVICE WITH IMPROVED WIRING CONTACT PORTION

BACKGROUND OF THE INVENTION

1. Field of the Invention

This invention relates to a semiconductor device and a method for manufacturing the same, and more particularly to the improvement of a wiring contact portion.

2. Description of the Related Art

In MOS LSIs, the contact planarizing technique and self-alignment contact (SAC) technique for forming contact holes become more important as the integration density becomes higher.

Recently, a silicon selective epitaxial growth (SEG) technique has received much attention as a technique for simultaneously completing the above two techniques.

A conventional method for manufacturing a semiconductor device using the SEG technique is explained below with reference to FIG. 1.

First, an n+-type source/drain diffused region 2 is formed in the surface area of a p-type semiconductor substrate 1. Then, an insulating layer 3 is formed on the substrate 1. Further, a contact hole is formed on the source/drain diffused region 2 by selectively etching the insulating layer 3. A natural oxide film (not shown) is formed on the source/drain diffused region 2.

After this, the contact hole is filled with a monocrystalline silicon (Si)layer 4 having the same conductivity type (n+-type) as the source/drain diffused region 2 by using the SEG technique. This forms an uneven surface area. Then, an Al(Aluminum) wiring layer 6 is formed on the uneven surface area including the upper area of the contact hole. Thus, the contact hole is filled with the monocrystalline silicon layer 4 and the Al wiring layer 6 is electrically connected to the source/drain diffused region 2 by using the SEG technique. With this construction, it appeared that the planarization of the contact hole and the self-alignment contact of the Al wiring layer could be attained at the same time.

However, in the fine contact of a highly integrated LSI, the width of the contact hole may be less than 1 micron so that the shape thereof may become substantially cylindrical. When the monocrystalline silicon layer is filled into the cylindrical contact hole by using the SEG technique, a plane surface or facet which is inclined with respect to the wafer surface is formed on the silicon layer. It is known that a facet with a (311) plane is formed when a Si (100) wafer is used, for example.

Therefore, as shown in FIG. 1, an upper area of the monocrystalline silicon layer cannot be fully planarized because of the presence of the facet 5 of the monocrystalline silicon layer 4 and a recess formed therein. That is, a difference in level caused by the contact hole can be improved in comparison with a case where the contact hole is not filled with the monocrystalline silicon layer 4, but it cannot be completely eliminated. Therefore, if the Al wiring layer 6 is formed under this condition, disconnection or breakage of the Al wiring layer 6 due to the difference in level may occur.

A complete planarization method for attaining a completely planarized surface, called a polycrystalline silicon selective growth technique, is known. In this case, a natural oxide(SiO) film on the source/drain diffused region is difficult to completely remove. Therefore, the SiO film is left between the polycrystalline silicon layer and the source/drain diffused region, and the resistance of the contact portion increases because of the presence of the SiO film.

As described above, the SEG technique has received much attention in the prior art, but since a facet is formed in the monocrystalline silicon layer which is filled into the contact hole using the SEG technique, the contact portion cannot be made completely flat. Further, in a case where the polycrystalline silicon layer is filled into the contact hole by using the selective growth technique, a natural oxide film cannot be completely removed, thereby increasing the resistance of the contact portion.

SUMMARY OF THE INVENTION

A first object of this invention is to provide a semiconductor device having a contact portion which is made sufficiently flat in practice.

A second object of this invention is to provide a semiconductor device including a contact portion, wherein the device has a practically sufficiently small resistance between a wiring layer, such as an Al wiring layer, and a semiconductor layer.

According to a first feature of the present invention there is provided a semiconductor device comprising a semiconductor layer, an insulating layer on the semiconductor layer, including a discontinuity therein, a monocrystalline silicon layer on a portion of semiconductor layer defined by the discontinuity, a non-monocrystalline silicon layer on the monocrystalline silicon layer, and a wiring layer on the non-monocrystalline silicon layer.

In a method of manufacturing the above semiconductor device having a wiring contact portion comprising the steps of providing a semiconductor layer, forming an insulating layer on the semiconductor layer, forming an opening in a portion of the insulating layer, selectively forming a monocrystalline silicon layer in the opening of the insulating layer, selectively forming a non-monocrystalline silicon layer on the monocrystalline silicon layer; and forming a wiring layer on the non-monocrystalline silicon layer.

These and other objects, features and advantages, of the present invention will be better understood from the following detailed description of the invention with reference to the attached drawings.

DETAILED DESCRIPTION OF THE PREFERRED EMBODIMENTS

There will now be described an embodiment of this invention with reference to the accompanying drawings.

Figure 1:
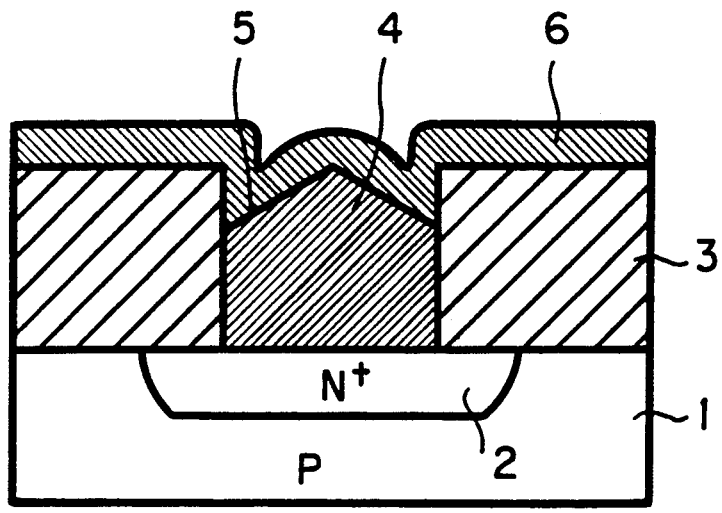
FIG. 1 is a cross sectional view of the conventional semiconductor device.
Figure 2:
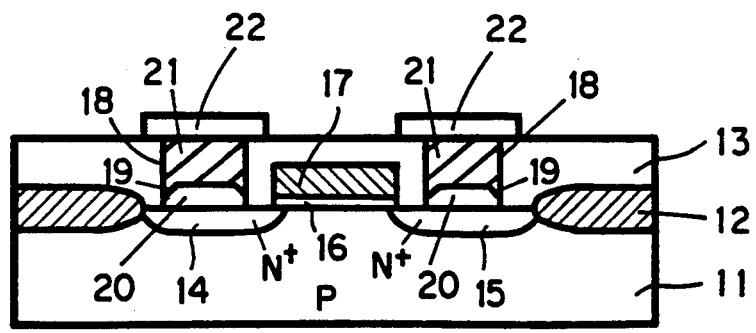
FIGS. 2 to 5 are diagrams showing the manufacturing steps of an N-channel MOS FET according to an embodiment of this invention.

The construction of an N-channel MOS FET according to one embodiment of this invention is shown in FIG. 2.

Figure 4:
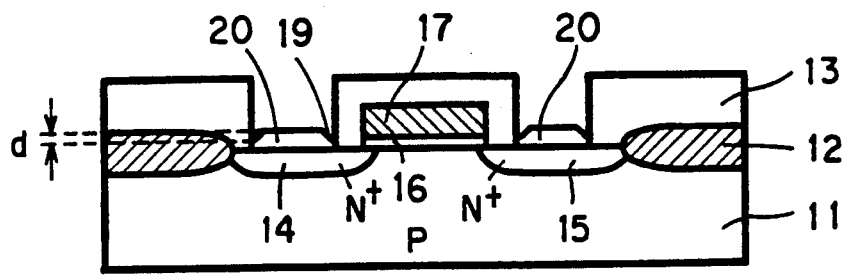

As shown in FIG. 2, n+ diffused regions (a source region 14 and a drain region 15 of an N-channel MOS FET) are formed in the surface area of a p-type semiconductor substrate 11. A gate electrode 17 is formed on the substrate surface between the source region 14 and drain region 15 with gate insulating layer 16 disposed therebetween. A thick insulating layer 13 having contact holes 18 is formed on the source region 14 and drain region 15 is formed on the semiconductor substrate 11. Further monocrystalline silicon layers 20 are formed in the respective contact holes 18. A facet 19 is formed on the upper portion of each of the monocrystalline silicon layers 20. Further, polycrystalline silicon layers 21 are formed on the monocrystalline silicon layers 20 in the contact holes 18 to fill the respective contact holes. The depth d of the facet 19 formed on the monocrystalline silicon layer 20, as shown in FIG. 4, is set less than the mean grain size of the polycrystalline silicon layer 21. As used herein, the depth d of the facet refers to the distance between an imaginary line substantially coincident with the plane of the upper surface of the monocrystalline silicon layer 20, and another line parallel thereto through the first point of contact of the monocrystalline silicon layer 20 with the side of the opening 18 in the direction of the semiconductor substrate 11. A1 wiring layers 22 are formed on the respective contact holes 18 which are made flat or planar, and the source region 14 and drain region 15 are electrically connected to the respective A1 wiring layers.

Next, a method for manufacturing the N-channel MOS FET according to one embodiment of this invention is explained with reference to FIGS. 2 to 5.

Figure 3:
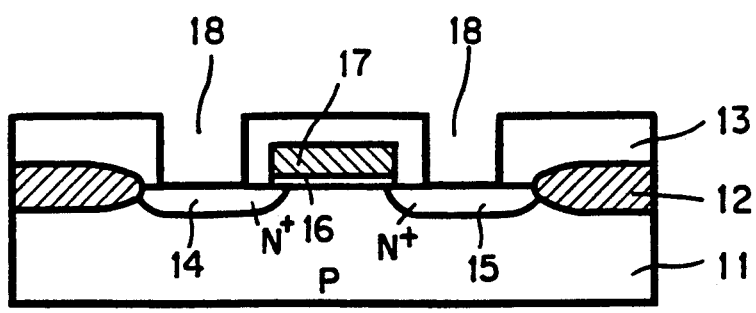

First, a field oxide layer 12 is selectively grown on the surface area of a p-type substrate 11 (for example, a (100) wafer). Then, a thin gate insulating layer 16 and a gate electrode 17 formed on the gate insulating layer 16 are formed by etching on a preset area in the substrate surface surrounded by the field oxide layer 12. After this, arsenic is diffused into those surface areas of the substrate which lie on both sides of the gate electrode to form source and drain regions 14 and 15 of the N-channel MOS FET. The source and drain regions 14 and 15 are n+ diffused regions having a surface impurity concentration of about $1.5 \times 10^{20}$ cm$^{-3}$. Then, an insulating layer 13 such as a silicon oxide layer is formed by deposition to a thickness of about 1.6 micron on the entire surface of the substrate, and those portions of the insulating layer which lie on the source and drain regions 14 and 15 are etched out to form cylindrical contact holes 18, as shown in FIG. 3. The width of the contact hole is about 0.8 micron. A natural oxide film is formed on the source/drain regions.

A silicon selective epitaxial growth process is effected is an atmosphere of SiH$_2$Cl$_2$, HCl and H$_2$ gases by using a process furnace so as to selectively grow monocrystalline silicon layers 20 with a thickness of about 0.2 micron in each of the contact holes 18, as shown in FIG. 4. The growth condition for the monocrystalline silicon layers is set as follows:

Temperature: 900° C., pressure: 25 Torr, flow rate of H$_2$: 100 l/m(liter/minute), flow rate of SiH$_2$Cl$_2$: 0.2 l/m, flow rate of HCl: 0.8 l/m, and growth speed: 300 Angstrom/minute.

At this time, natural oxide films formed on the source and drain regions 14 and 15 are completely removed by the SEG technique for forming the monocrystalline silicon layer 20. As a result, the source and drain regions 14 and 15 can be electrically connected with a small resistance to the monocrystalline silicon layers 20 formed thereon. Further, a facet 19 with a depth d of 0.1 micron is formed on the upper surface of the monocrystalline silicon layer 20.

Figure 5:
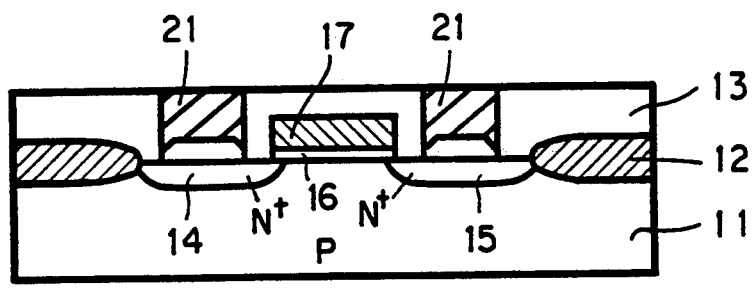

Next, polycrystalline silicon layers 21 having a thickness of about 1.4 micron are selectively grown on the respective monocrystalline silicon layers in the contact holes 18, so as to fill the contact holes without the need to remove the substrate from the process furnance, that is without exposing the substrate to the oxidizing gas atmosphere, as shown in FIG. 5. The growth condition of the polycrystalline silicon layer 21 is set as follows:

Temperature: 900° C., pressure: 10 Torr, flow rate of H$_2$: 100 l/m, flow rate of SiH$_2$Cl$_2$: 0.2 l/m, flow rate of HCl: 0.8 l/m, and growth speed: 100 Angstrom/minute.

Since, in this case, the substrate surface is not exposedto the oxidizing gas atmosphere, no natural oxide film (SiO$_2$ film) is formed on the monocrystalline silicon layers 20. As a result, the monocrystalline silicon layer 20 and the polycrystalline silicon layer 21 are electrically connected to each other with a small resistance.

The growth conditions for the monocrystalline silicon layer 20 and polycrystalline silicon layer 21 are controlled so that the depth d of the facet formed on the monocrystalline silicon layer 20 is less than the mean grain size of the polycrystalline silicon layer 21. For example, when the depth d of the facet is about 0.1 micron, it is preferable to set the mean grain size of the polycrystalline silicon layer to about 0.15 micron. As the result of this, the upper portion of the contact hole 18 can be made sufficiently flat or planar in practice. If the mean grain size of the polycrystalline silicon layer becomes excessively large, it becomes difficult to make the upper portion of the contact hole 18 flat. Therefore, it is preferable to set the thickness of the monocrystalline silicon layer 20 as small (less than 0.3 micron) as possible. With the same process furnace, it is possible to change the selectively grown silicon layer from monocrystal to polycrystal by adequately controlling the growth condition, such as the gas concentration, pressure, temperature and gas flow rate.

After this, an impurity such as phosphorus (P) or arsenic (As), which has the same conductivity type as the diffused regions 14 and 15 lying under the respective contact holes 18, is ion-implanted into the monocrystalline silicon layer 20 and polycrystalline silicon layer 21 in the contact holes, and then a heat treatment is effected in an atmosphere of about 900° C. Next, A1 wiring layers 22 are formed on the planarized upper portions of the contact holes 18, and in this way, the n+ diffused regions 14 and 15 and the respective A1 wiring layers 22 are electrically connected to each other.

The doping of the impurity into the monocrystalline and polycrystalline silicon layers can be effected by mixing a preset impurity into the monocrystalline and polycrystalline silicon layers at the same time as these layers are formed in the process furnace.

With the structure described above, when the silicon layers are filled into the contact holes 18, the monocrystalline silicon layers 20 are first formed by use of the SEG technique and then the polycrystalline silicon layers 21 are formed by deposit. Natural oxide films lying on the n+ diffused layers 14 and 15 can be completely removed by the SEG technique used for forming the monocrystalline silicon layer 20, thereby making it possible to electrically connect the n+ diffused layers 14 and 15 to the respective monocrystalline silicon layers 20 with only a small resistance. Natural oxide films are removed by prebaking in the H$_2$ atmosphere (hydrogen reduction of natural oxide). Further, since the polycrystalline silicon layers 21 are selectively grown without exposing the substrate to an oxidizing atmosphere after the monocrystalline silicon layers 20 are formed, a good electrical contact can be obtained between the monocrystalline silicon layer 20 and the polycrystalline silicon layer 21. In addition, since the depth d of the facet 19 formed on the monocrystalline silicon layer 20 is set to be less than the mean grain size of the polycrystalline silicon layer 21, influence by the facet 19 can be minimized and the portion corresponding to the contact hole 18 can be made substantially flat.

According to the embodiment described above, the self-alignment contact and the planarization of the contact can be attained at the same time without lowering the manufacturing yield of the device. The self-alignment contact and the planarization of the contact make it possible to reduce the memory cell area by more than 10% in memory devices such as DRAMs, for example. Further, in a fine highly integrated device, the chip size cannot be reduced as required, and it is difficult to set the chip into a package, thus making it difficult to produce practical highly integrated devices. However, since the cell area can be reduced in this invention, the chip area can be reduced without lowering the manufacturing yield, thus making it possible practically to produce more highly integrated devices.

Table I shows the result of an evaluation of the defective percentage of the Al wiring layers and the contact resistance of test devices formed according to the first and second embodiments and cases 1 and 2, corrsponding to two conventional devices.

TABLE I

| | first embodiment | second embodiment | conventional case 1 | conventional case 2 |
|---|---|---|---|---|
| thickness of monocrystalline silicon layer (micron) | 0.2 | 0.6 | 1.6 | — |
| thickness of polycrystalline silicon layer (micron) | 1.4 | 1.0 | — | 1.6 |
| depth of facet (micron) | 0.1 | 0.3 | 0.4 | 0 |
| mean grain size (micron) | 0.15 | 0.15 | — | 0.15 |
| contact resistance (ohm) | 100 | 100 | 100 | 1000 |
| percentage difective (percentage) | 0 | 10 | 20 | 0 |

In this case, the second embodiment is obtained by increasing the thickness of the monocrystalline silicon layer in the contact hole in comparison with the first embodiment, that is setting the thickness of the monocrystalline silicon layer to about 0.6 micron and setting the thickness of the polycrystalline silicon layer to about 1.0 micron. In the second embodiment, the depth of the facet on the monocrystalline silicon layer is about 0.3 micron. Further, in conventional case 1, only a monocrystalline silicon layer of 1.6 micron thickness is selectively grown in the contact hole. In conventional case 1, the depth of the facet on the monocrystalline silicon layer is about 0.4 micron. Further, in conventional case 2, only a polycrystalline silicon layer of 1.6 micron thickness is selectively grown in the contact hole. The contact resistance is about 100 ohms in the first and second embodiments and in conventional case 1, but it is more than 1000 ohms in conventional case 2. The reason the contact resistance is large in conventional case 2 is believed to be that the natural oxide film formed on the n+ diffused region cannot be completely removed. Further, the defective percentage of the Al wiring layer is 0% in the first embodiment and in conventional case 2, it is about 10% in the second embodiment, and it is about 20% in conventional case 1. This is believed to have occurred because influence by the facet cannot be completely eliminated in the second embodiment and conventional case 1, and the contact portion cannot be made sufficiently flat. Thus, a difference in level may be caused in the peripheral portion of the contact hole causing breakage of the Al wiring layer. When the test devices were actually cut apart and the cross-sections of the contact portions thereof were observed by use of a scanning electron microscope (SEM), it was observed that the contact portions were made flat in the first embodiment and in conventional case 2, but the contact portions were not made completely flat in the second embodiment and in conventional case 1 because of the presence of the facet.

Figure 6:
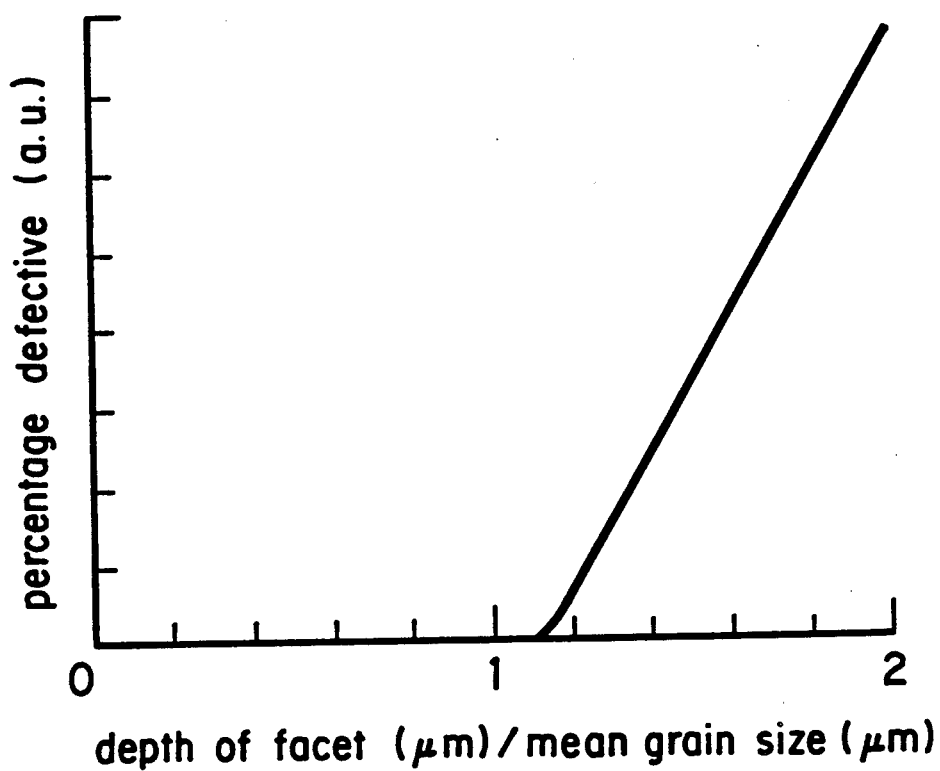
FIG. 6 is a diagram showing variation in the defective percentage of the resistance of Al wiring layers with respect to the ratio of the facet depth of the monocrystalline silicon layer to the mean grain size of the polycrystalline silicon layer.

FIG. 6 shows variation in the defective percentage (represented by an arbitrary unit) of the Al wiring layer with respect to the relation between the depth (micron) of the facet on the monocrystalline silicon layer and the mean grain size (micron) of the polycrystalline silicon layer based on the above results.

That is, in a case where the depth of the facet on the moncrystalline silicon layer is smaller than the mean grain size of the polycrystalline silicon layer, the percentage defective of the Al wiring layer is substantially 0%. However, when the depth of the facet exceeds the mean grain size, the percentage defective the Al wiring layer is increased. This is because the mean grain size of the polycrystalline silicon layer becomes small in comparison with the depth of the facet, so that influence by the facet cannot be completely eliminated even when the polycrystalline silicon layer is filled into the contact hole, thereby making it impossible to make the portion of the contact hole completely flat.

Further, samples having monocrystalline silicon layers with various thicknesses beginning from 0 microns in the contact hole were prepared, polycrystalline silicon layers were selectively grown on the monocrystalline silicon layers, and then the flatness of the contact portion thus obtained was evaluated by using the SEM. In this case, the depth of the facet on the monocrystalline silicon layer was always maintained less than the mean grain size of the polycrystalline silicon layer. As the result of this, it was confirmed that the contact portion could be make sufficiently flat when the thickness of the monocrystalline silicon layer was less than 0.3 micron. This is because the mean grain size of the polycrystalline silicon layer becomes excessively large when the thickness of the monocrystalline silicon layer is larger than 0.3 micron and the upper portion of the contact hole cannot be made sufficiently flat.

In the above embodiment, the polycrystalline silicon layer 21 is formed on the monocrystalline silicon layer 20. However, it is also possible to form a different non-monocrystalline silicon layer, such as an amorphous silicon layer, on the monocrystalline silicon layer 20 in order to attain the practically sufficiently flat surface and sufficiently low contact resistance. Further, n-type impurity (phosphorus, arsenic) is doped into the monocrystalline silicon layer 20 and polycrystalline silicon layer 21, but p-type impurity is doped when the diffused regions 14 and 15 under the contact holes 18 are formed of p+ regions. In addition, the insulating layer 13 formed on the semiconductor substrate 11 is not limited to SiO2, and an insulating layer of other material and structure can be used to attain the same effect.

Numerous modifications and variations of the present invention are possible in light of the above teachings. It is therefore to be understood that, within the scope of the appended claims, the present invention can be practiced in a manner other than as specifically described herein.

What is claimed is:

1. A semiconductor device having a wring contact portion comprising:

a semiconductor layer of first conductivity type, including a surface area;

an impurity layer of second conductivity type in the surface area of the semiconductor layer;

an insulating layer on the semiconductor layer including a discontinuity therein at a location corresponding to at least a part of the impurity layer;

a monocrystalline silicon layer on a portion of the impurity layer defined by the discontinuity;

a non-monocrystalline silicon layer on the monocrystalline silicon layer;

a facet on an upper surface of said monocrystalline layer with the facet extending within said discontinuity to a depth less than a depth of said discontinuity; and a wiring layer on the non-monocrystalline silicon layer.

2. A device according to claim 1, wherein the non-monocrystalline silicon layer comprises a polycrystalline silicon layer.

3. A device according to claim 2, wherein said depth of said facet is smaller than a mean grain size of the polycrystalline silicon layer.

4. A device according to claim 1, wherein the non-monocrystalline silicon layer comprises amorphous silicon.

5. A device according to claim 1, wherein the monocrystalline silicon layer has a thickness less than about 0.6 micron.

6. A device according to claim 1, wherein the monocrystalline silicon layer and the non-monocrystalline silicon layer each includes an impurity of the second conductivity type.

* * * * *